United States Patent
Kim

(10) Patent No.: US 10,403,383 B2
(45) Date of Patent: Sep. 3, 2019

(54) REPAIR DEVICE AND SEMICONDUCTOR DEVICE INCLUDING THE REPAIR DEVICE

(71) Applicant: SK hynix Inc., Icheon-si Gyeonggi-do (KR)

(72) Inventor: Sang Hee Kim, Incheon (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 58 days.

(21) Appl. No.: 15/667,189

(22) Filed: Aug. 2, 2017

(65) Prior Publication Data

US 2018/0261297 A1  Sep. 13, 2018

(30) Foreign Application Priority Data

Mar. 8, 2017  (KR) .................. 10-2017-0029645

(51) Int. Cl.
*G11C 29/04* (2006.01)
*G11C 29/00* (2006.01)

(52) U.S. Cl.
CPC ............ *G11C 29/04* (2013.01); *G11C 29/787* (2013.01); *G11C 29/789* (2013.01); *G11C 29/84* (2013.01); *G11C 2029/0401* (2013.01)

(58) Field of Classification Search
CPC .................................................. G11B 20/1889
USPC ......................................... 714/710, 769, 765
See application file for complete search history.

(56) References Cited

U.S. PATENT DOCUMENTS

| | | | |
|---|---|---|---|
| 9,336,906 B2 | 5/2016 | Lee et al. | |
| 9,418,762 B1 * | 8/2016 | You | G11C 29/78 |
| 9,805,828 B1 * | 10/2017 | Yoko | G11C 17/16 |
| 2016/0300627 A1 * | 10/2016 | You | G11C 29/78 |
| 2017/0256326 A1 * | 9/2017 | You | G06F 11/0727 |

\* cited by examiner

*Primary Examiner* — Fritz Alphonse
(74) *Attorney, Agent, or Firm* — William Park & Associates Ltd.

(57) ABSTRACT

A repair device and a semiconductor device are disclosed, which relate to a technology for supporting a plurality of post package repairs (PPRs). The repair device may include a plurality of PPR fuse sets. The repair device may be configured such that if any one of the plurality of PPR fuse sets is selected, the remaining PPR fuse sets may be initialized.

20 Claims, 4 Drawing Sheets

REPAIR DEVICE AND SEMICONDUCTOR DEVICE INCLUDING THE REPAIR DEVICE

CROSS-REFERENCE TO RELATED APPLICATION

This application claims priority based upon Korean patent application No. 10-2017-0029645, filed on Mar. 8, 2017, the disclosure of which is hereby incorporated in its entirety by reference herein.

BACKGROUND

1. Technical Field

Embodiments of the present disclosure may generally relate to a repair device and a semiconductor device including the repair device, and more particularly to post package repairs (PPRs).

2. Related Art

A semiconductor memory device includes a large number of memory cells integrated into one chip. However, if a defective or failed cell occurs in at least one memory cell from among a plurality of memory cells, it is impossible for a semiconductor memory device to operate normally. As a result, the semiconductor memory device having the defective cell is regarded as a defective product and abandoned. Semiconductor memory devices have been developed to have higher degrees of integration and operate at higher speeds, however higher degrees of integration and operating speeds increase the possibility of defective cells. Provided that the entirety of the semiconductor device is discarded due to a defect generated in only a few memory cells among all memory cells contained in the semiconductor memory device, the discarding of the entirety of the semiconductor memory device is cost ineffective and is far from productivity efficiency.

As a result, a production yield denoted by the ratio of a total number of chips to the number of normal chips, which is needed for deciding production costs of semiconductor memory devices, is gradually reduced. Therefore, in order to increase a production yield of semiconductor memory devices, many developers and companies are conducting intensive research into a method for fabricating highly-integrated semiconductor memory devices configured to operate at higher speeds and a method for efficiently repairing defective cells.

Generally, the semiconductor memory device includes a redundancy memory cell. When defective or failed memory cells occur after completion of such packaging, the defective memory cells are replaced with redundancy memory cells, such that the semiconductor memory device can be processed as a normal product. A method for replacing defective memory cells with redundancy memory cells after completion of a test in the packaged state is referred to as a post package repair (PPR).

The post package repair (PPR) technology can repair defective memory cells that are not discovered in a wafer state and generated after packaging completion, using an electrical fuse (e.g., array E-fuse: ARE), such that package productivity can increase through the post package repair (PPR) process.

SUMMARY

In accordance with an embodiment of the present disclosure, a repair device may be provided. The repair device may include a buffer circuit configured to generate an address by buffering an external address during a soft-post package repair (SPPR) mode. The repair device may include a plurality of PPR fuse sets configured to output a fuse signal including repair information by latching the address during the SPPR mode, and generate a reset signal corresponding to a fuse signal during activation of an SPPR enable signal. If any one of the plurality of PPR fuse sets is selected in response to a selection signal, the remaining PPR fuse sets may be initialized in response to the reset signal.

In accordance with an embodiment of the present disclosure, a semiconductor device may be provided. The semiconductor device may include a buffer circuit configured to generate an address by buffering an external address during a soft-post package repair (SPPR) mode. The semiconductor device may include a plurality of PPR fuse sets configured to output a fuse signal including repair information by latching the address during the SPPR mode, and generate a reset signal corresponding to a fuse signal during activation of an SPPR enable signal. The semiconductor device may include a bank group configured to access a redundancy memory cell in response to the fuse signal, and perform a repair operation. If any one of the plurality of PPR fuse sets is selected in response to a selection signal, the remaining PPR fuse sets may be initialized in response to the reset signal.

DETAILED DESCRIPTION

Reference will now be made to embodiments of the present disclosure, examples of which are illustrated in the accompanying drawings. Wherever possible, the same reference numbers are used throughout the drawings to refer to the same or like portions.

Various embodiments of the present disclosure may be directed to providing a repair device and a semiconductor device including the same that substantially obviate one or more problems due to limitations and disadvantages of the related art.

An embodiment of the present disclosure may relate to a technology for reducing the number of defective repairing times by allocating priorities to fuses in a repair device configured to support a plurality of post package repairs (PPRs).

The operation for repairing one or more defective cells of the semiconductor memory device may be classified into a first repair operation performed in a wafer state and a second repair operation performed in a package state.

The repair operation performed in the package state will hereinafter be referred to as a post package repair (PPR) operation.

A semiconductor memory device may include a fuse circuit capable of programming an address corresponding to a repair target memory cell indicating a defective cell. In this case, the programming operation may refer to an operation for storing address information corresponding to the repair target memory cell to store repair address information in a redundancy memory cell instead of the repair target memory cell.

If an attempt to access the repair target memory cell is received from the external part by the repair operation, the redundancy memory cell can be accessed by referring to the programmed repair address.

Figure 1:
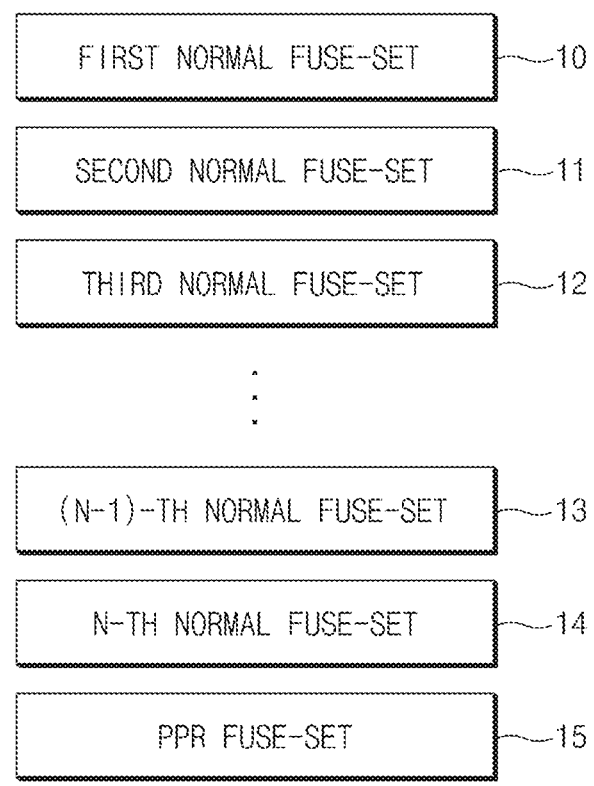
FIG. 1 is a block diagram illustrating a representation of an example of a fuse set contained in a general fuse circuit according to an embodiment of the present disclosure.

FIG. 1 is a block diagram illustrating a representation of an example of a fuse set contained in a general fuse circuit according to an embodiment of the present disclosure.

Referring to FIG. 1, a fuse circuit may include a plurality of normal fuse sets 10~14 and a single post package repair (PPR) fuse set 15. In this case, the plurality of normal fuse sets 10~14 may be allocated to store repair address information in a wafer state corresponding to a fabrication stage of the semiconductor memory device. The PPR fuse set 15 may be allocated to store repair address information in the package state after fabrication completion of the semiconductor memory device. FIG. 1, for example, illustrates that there are N normal fuse-sets, where N is a natural number greater than zero.

Upon receiving a command for performing the repair operation from the external part, the semiconductor memory device may perform the PPR operation. The semiconductor memory device enters the PPR mode, such that the semiconductor memory device may perform the PPR operation for storing repair address information received from the external part in the PPR fuse set 15.

The semiconductor memory device may include a PPR mode in specification to properly cope with a defect or failure encountered in a system. The PPR mode may be largely classified into a hard-PPR (HPPR) mode and a soft-PPR (SPPR) mode. The HPPR mode may refer to a permanent repair in which the repair effect can be maintained even when the semiconductor memory device is powered off. The SPPR mode may refer to a mode in which a register or latch circuit latches repair address information received from the external part and stores the latched repair address information therein. Although the SPPR mode can reduce a time consumed for the repair operation, the SPPR mode may indicate a temporary repair in which the repair effect disappears when the semiconductor memory device is powered off.

For example, it is assumed that the repair operation for replacing a specific memory cell X with a redundancy memory cell Y is carried out. As a result, a hard repair operation for the memory cell X need not be performed again. However, if it is assumed that the soft repair operation for replacing the memory cell X with the redundancy memory cell Y is performed, the repair operation for the memory cell X must be carried out whenever a power-supply voltage is newly supplied to the memory device.

A single PPR fuse set 15 for performing the PPR mode may be allocated to each bank group according to specification. However, a request for supporting a plurality of PPRs is being received from specific customers.

The HPPR mode may be carried out within a time section (e.g., a time section based on seconds) having a relatively sufficient program time. The HPPR mode may have no problem in performing a plurality of HPPR operations because the repair operation in the HPPR mode is performed through different operations classified into a rupture operation and a boot-up operation. However, the SPPR mode may have difficulty in supporting a plurality of SPPR operations because the program operation in the SPPR mode is performed within a relatively short time section (e.g., a time section based on nanoseconds (ns)).

Therefore, the semiconductor device according to an embodiment includes a plurality of PPR fuse sets to support a plurality of SPPR operations, allocates priorities to the PPR fuse sets, and thus may prevent the occurrence of one or more defective repair operations.

Figure 2:
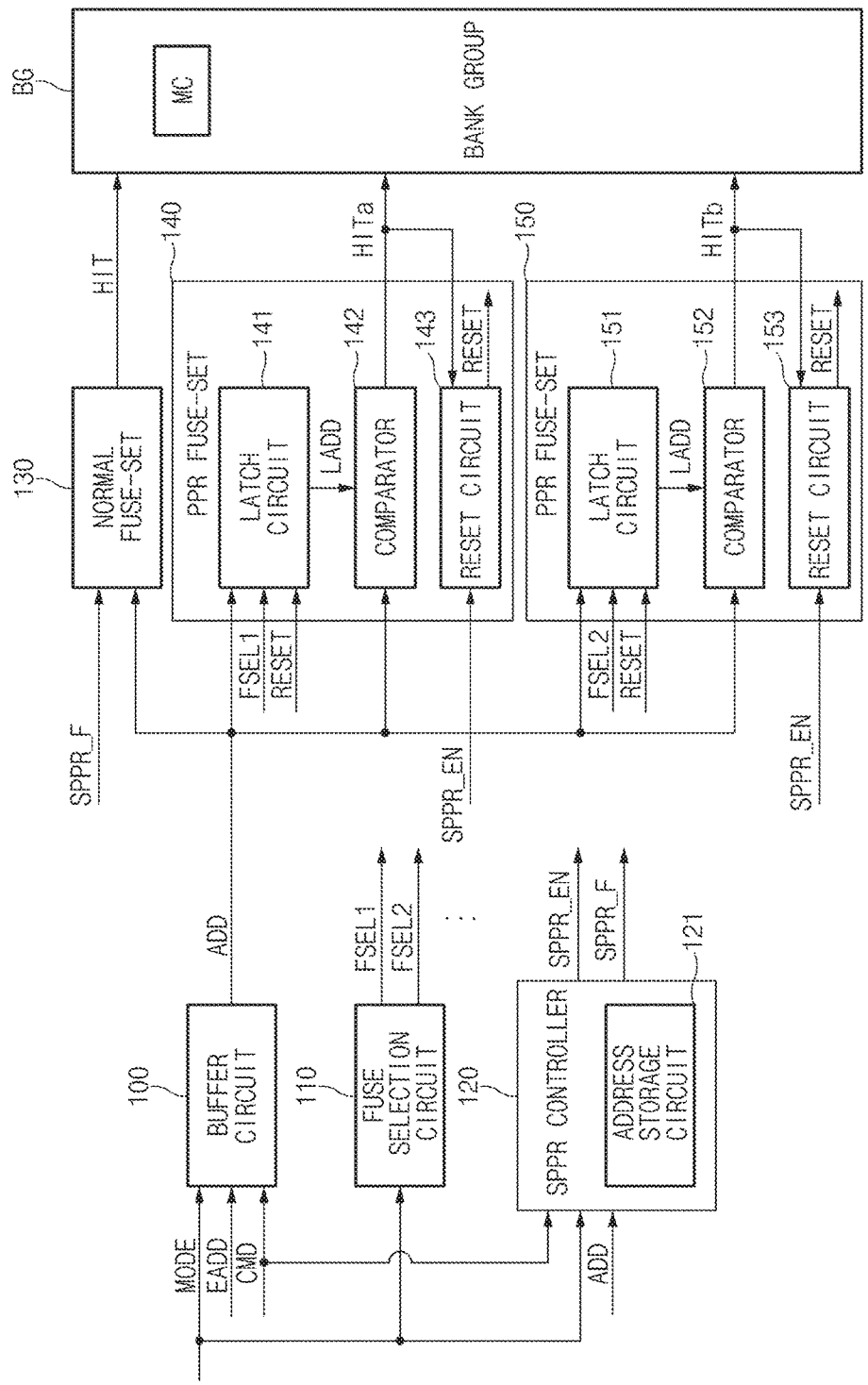
FIG. 2 is a block diagram illustrating a representation of an example of a semiconductor device according to an embodiment of the present disclosure.

FIG. 2 is a block diagram illustrating a representation of an example of the repair device according to an embodiment of the present disclosure.

Referring to FIG. 2, the repair device according to an embodiment may include a buffer circuit 100, a fuse selection circuit 100, an SPPR controller 120, a normal fuse set 130, and a plurality of PPR fuse sets 140 and 150.

Upon receiving a mode signal MODE and a command signal CMD, the buffer circuit 100 may receive and buffer (receive/buffer) an external address EADD, and may output an address ADD. In this case, the mode signal MODE may be used to establish the repair mode, the HPPR mode, or the SPPR mode, and may also be established through a mode register set (MRS). In an embodiment, for example, the buffer circuit 100 is configured to control the SPPR mode according to a mode register set (MRS).

In accordance with an embodiment of the present disclosure, when the mode signal MODE is activated by the SPPR command received from the external part, the repair device contained in the semiconductor device may enter the SPRR mode. If the command signal CMD (e.g., the active signal) is applied to the semiconductor device, the repair device may store the address ADD generated by the external address EADD in the PPR fuse sets 140 and 150. If the mode signal MODE is deactivated, the repair device may enter a normal repair mode for controlling the normal fuse set 130 for a vendor. For example, the mode signal MODE is deactivated by the mode register set, such that the repair device terminates the SPPR mode and then enters the normal repair mode.

When the mode signal MODE is activated, the fuse selection circuit 110 may generate the selection signal FSEL1 or FSEL2 for selecting any one of the plurality of PPR fuse sets 140 and 150. For example, if the selection signal FSEL1 is activated by activation of the mode signal MODE, the fuse selection circuit 110 may select the PPR fuse set 140. If the selection signal FSEL2 is activated, the fuse selection circuit 110 may select the PPR fuse set 150. In this case, the fuse selection circuit 110 may include a counter therein such that the plurality of selection signals FSEL1 and FSEL2 can be sequentially activated using the counter.

The SPPR controller 120 may store the address ADD when the mode signal MODE is activated. That is, if the command signal CMD (e.g., a write signal) is activated when the repair mode enters the SPPR mode according to the mode signal MODE, the SPPR controller 120 may store the address ADD therein. In this case, the address ADD may be stored in an address storage circuit 121 contained in the SPPR controller 120. The address ADD may include row address information and bank address information from among repair address information.

During activation of the command signal CMD (e.g., the active signal), the SPPR controller 120 may generate an SPPR flag signal SPPR_F for masking the output signal of the normal fuse set 130 in response to the address ADD stored in the address storage circuit 121. In this case, the normal fuse set 130 may include a plurality of vendor-purposed fuses.

That is, during activation of the command signal CMD, the SPPR controller 120 may output the SPPR flag signal SPPR_F for disabling an output signal of one fuse set corresponding to the address ADD from among the normal fuse sets 130. In this case, the command signal CMD may correspond to the active signal ACT. That is, when the SPPR flag signal SPPR_F is activated, a fuse signal HIT generated from the normal fuse set 130 may be masked.

The SPPR controller 120 may activate the SPPR enable signal SPPR_EN for performing the SPPR operation when the mode signal MODE is activated. That is, when repair address information stored in the address storage circuit 121 is identical to the input address ADD during the SPPR mode, the SPPR controller 120 may activate the SPPR enable signal SPPR_EN. The SPPR enable signal SPPR_EN may be an enable signal for activating the PPR fuse sets 140 and 150 instead of the normal fuse set 130 when the repair device enters the SPPR mode. In an embodiment, for example, the SPPR controller 120 may be configured to control the SPPR enable signal SPPR_EN in response to a comparison result between the address ADD and the pre-stored repair address information.

If the repair device enters the SPPR mode by activation of the mode signal MODE, a word line of a bank group BG may be activated in response to the fuse signals HITa and HITb. In this case, if once-repaired address is re-selected due to occurrence of a defective or failed product in a product fabrication process of vendors, a plurality of word lines may be simultaneously activated by the fuse signal HIT of the normal fuse set 130. The bank group BG may include one or more redundancy memory cells MC.

For example, defective or failed address information has already been stored in the normal fuse set 130 by the repair operation performed in the fabrication stage of the semiconductor memory device. The buffer circuit 100 of the semiconductor memory device may receive the external address EADD from the external part. The normal fuse set 130 may receive the pre-stored repair address information and the address ADD, and may compare the received address ADD with the pre-stored repair address information. If the repair address information stored in the normal fuse set 130 is identical to the input address ADD, the fuse signal HIT may be activated. The semiconductor memory device may normally access the redundancy memory cell contained in the redundancy region of the bank group BG in response to the activated fuse signal HIT. In an embodiment, for example, the pre-stored repair address information may include a pre-stored address.

However, if a defect or failure occurs in the once-repaired address due to deterioration of the redundancy memory cell, a user of the semiconductor memory device may determine the corresponding memory cell to be a defective or failed memory cell. As a result, the corresponding address may be stored in the PPR fuse set (e.g., 140) may be stored in the semiconductor memory device through the SPPR mode.

In this case, the semiconductor memory device having entered the SPPR mode according to the SPPR command received from the external part may receive defective address information, such that the semiconductor memory device may store the address ADD in the PPR fuse set 140. Thereafter, if the semiconductor memory device receives the address ADD from the external part, the input address ADD is identical to the address stored in the latch circuit 141, such that the fuse signal HIT of the normal fuse set 130 and the other fuse signal HITa generated by a comparator 142 may be simultaneously activated. As a result, the redundancy memory cell corresponding to the fuse signal HIT and the redundancy memory cell corresponding to the other fuse signal HITa can be simultaneously accessed.

When defective address information stored in the PPR fuse set 140 through the SPPR mode is identical to the repair address information stored in the normal fuse set 130 in a fabrication stage, the redundancy memory cell corresponding to the PPR fuse set 140 and the redundancy memory cell corresponding to the normal fuse set 130 are simultaneously accessed, such that a read failure may occur in the normal operation.

Therefore, when the repair device enters the SPPR mode according to an embodiment of the present disclosure, the SPPR flag signal SPPR_F is activated, such that the output signal of the normal fuse set 130 can be masked.

The plurality of PPR fuse sets 140 and 150 may store the address ADD for performing the repair operation when the repair device enters the SPPR mode during activation of the mode signal MODE.

The PPR fuse set 140 may include a latch circuit 141, a comparator 142, and a reset circuit 143. In this case, during activation of the selection signal FSEL1, the latch circuit 141 may store the address ADD including repair information, and may output a latch address LADD. During activation of the reset signal RESET, the latch circuit 141 may initialize the stored address. In an embodiment, for example, if any one of the plurality of PPR fuse sets (i.e., 140, 150) is selected in response to a selection signal (i.e., FSEL1, FSEL2), the remaining PPR fuse sets (i.e., 140 or 150) are initialized in response to the reset signal RESET. In an embodiment, for example, if a PPR fuse set 140 is selected in response to the selection signal FSEL1, the PPR fuse set 150 is initialized in response to the reset signal RESET. In an embodiment, for example, if a PPR fuse set 150 is selected in response to the selection signal FSEL2, the PPR fuse set 140 is initialized in response to the reset signal RESET.

The comparator 142 may compare the input address ADD with the latch address LADD, and may thus output the fuse signal HITa to the bank group BG and the reset circuit 143. That is, assuming that the address ADD is not identical to the latch address LADD, the comparator 142 may determine that the corresponding address is not repaired, such that the comparator 142 may deactivate the fuse signal HITa. When the address ADD is identical to the latch address LADD, the comparator 142 may determine that the corresponding address is repaired, such that the comparator 142 may activate the fuse signal HITa. If the fuse signal HITa is activated, the redundancy memory cell corresponding to the PPR fuse set 140 may be accessed in the bank group BG.

In addition, the reset circuit 143 may receive the comparison signal HITa, and may thus output the reset signal RESET to the latch circuit 141. In this case, when the fuse signal HITa is activated in the activation state of the SPPR enable signal SPPR_EN, the reset circuit 143 may enable the reset signal RESET such that the operation of the reset circuit 141 can be reset.

The PPR fuse set 150 may include a latch circuit 151, a comparator 152, and a reset circuit 153. In this case, when the selection signal FSEL2 is activated, the latch circuit 151 may store the address ADD including repair information, and may then output the latch address LADD. The latch circuit 151 may initialize the stored address during activation of the reset signal RESET. In an embodiment, for example, if any one of the plurality of PPR fuse sets (i.e., 140, 150) is selected in response to a selection signal (i.e., FSEL1, FSEL2), the remaining PPR fuse sets (i.e., 140 or 150) are initialized in response to the reset signal RESET.

The comparator 152 may compare the input address ADD with the latch address LADD, and may output the fuse signal HITb to the bank group BG and the reset circuit 153. That is, when the address ADD is not identical to the latch address LADD, the comparator 152 may determine that the corresponding address is not repaired, such that the fuse signal HITb is deactivated. When the address ADD is identical to the latch address LADD, the comparator 152 may determine that the corresponding address is repaired, such that the fuse signal HITb is activated. If the fuse signal HITb is activated, the redundancy memory cell corresponding to the PPR fuse set 150 is accessed in the bank group BG.

In addition, the reset circuit 153 may receive the comparison signal HITb, and may thus output the reset signal RESET to the latch circuit 151. In this case, if the fuse signal HITb is activated in the activation state of the SPPR enable signal SPPR_EN, the reset signal RESET is enabled, such that the operation of the latch circuit 152 can be reset.

If the plurality of PPR fuse sets 140 and 150 are activated when the semiconductor device enters the SPPR mode, two word lines are simultaneously activated in response to the fuse signals HITa and HITb, such that a defective or failed repair may occur. Therefore, the semiconductor device according to an embodiment of the present disclosure can prevent occurrence of the defective or failed repair by allocating priorities to the plurality of PPR fuse sets 140 and 150.

For example, it is assumed that the same address ADD is stored in the plurality of PPR fuse sets 140 and 150. It is also assumed that the repair address is stored in the PPR fuse set 140 and the same address ADD is attempted to be stored in the PPR fuse set 140.

If the selection signal FSEL1 is activated, the address ADD is stored in the latch circuit 141 of the PPR fuse set 140. The comparator 142 may compare the latch address LADD with the address ADD. If the latch address LADD is identical to the address ADD, the comparator 142 may activate the fuse signal HITa.

During the SPPR mode, if the SPPR enable signal SPPR_EN is deactivated and the fuse signal HITa is activated, the reset circuit 143 may activate the reset signal RESET. As a result, the latch circuit 141 of the PPR fuse set 140 may be reset by the reset signal RESET, such that the fuse signal HITa may be deactivated.

The PPR fuse set 140 may store the same address ADD in the latch circuit 141 during activation of the selection signal FSEL2. The fuse signal HITb may be activated according to the comparison operation of the comparator 152.

Figure 3:
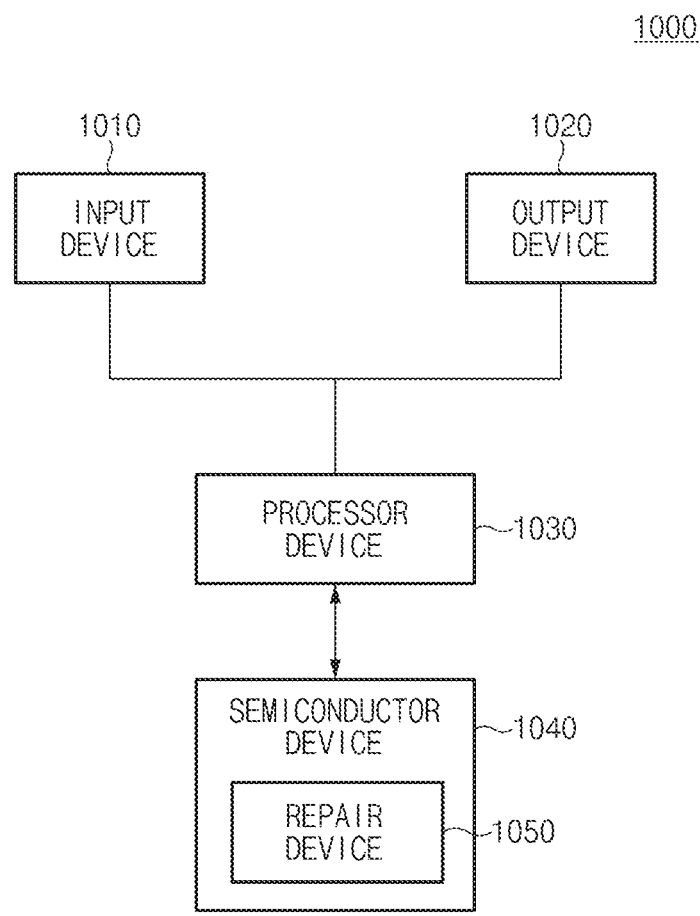
FIG. 3 is a block diagram illustrating a representation of an application example of an electronic system including the repair device according to an embodiment of the present disclosure.

FIG. 3 is a block diagram illustrating an application example of an electronic system including the repair device according to an embodiment of the present disclosure.

Referring to FIG. 3, the electronic system 1000 may include an input device 1010, an output device 1020, a processor device 1030, and a semiconductor device 1040. In this case, the processor device 1030 may control the input device 1010, the output device 1020, and the semiconductor device 1040 through the corresponding interfaces.

The processor device 1030 may include at least any one of at least one microprocessor, at least one digital signal processor, at least one microcontroller, and logic circuits capable of performing the same or similar functions as these components.

The input device 1010 may include at least one selected among a keyboard, a mouse, a keypad, a touchscreen, a scanner, and so forth. The output device 1020 may include at least one selected among a monitor, a speaker, a printer, a display device, and so forth. The semiconductor device 1040 may include the repair device 1050 described in the aforementioned embodiments.

Figure 4:
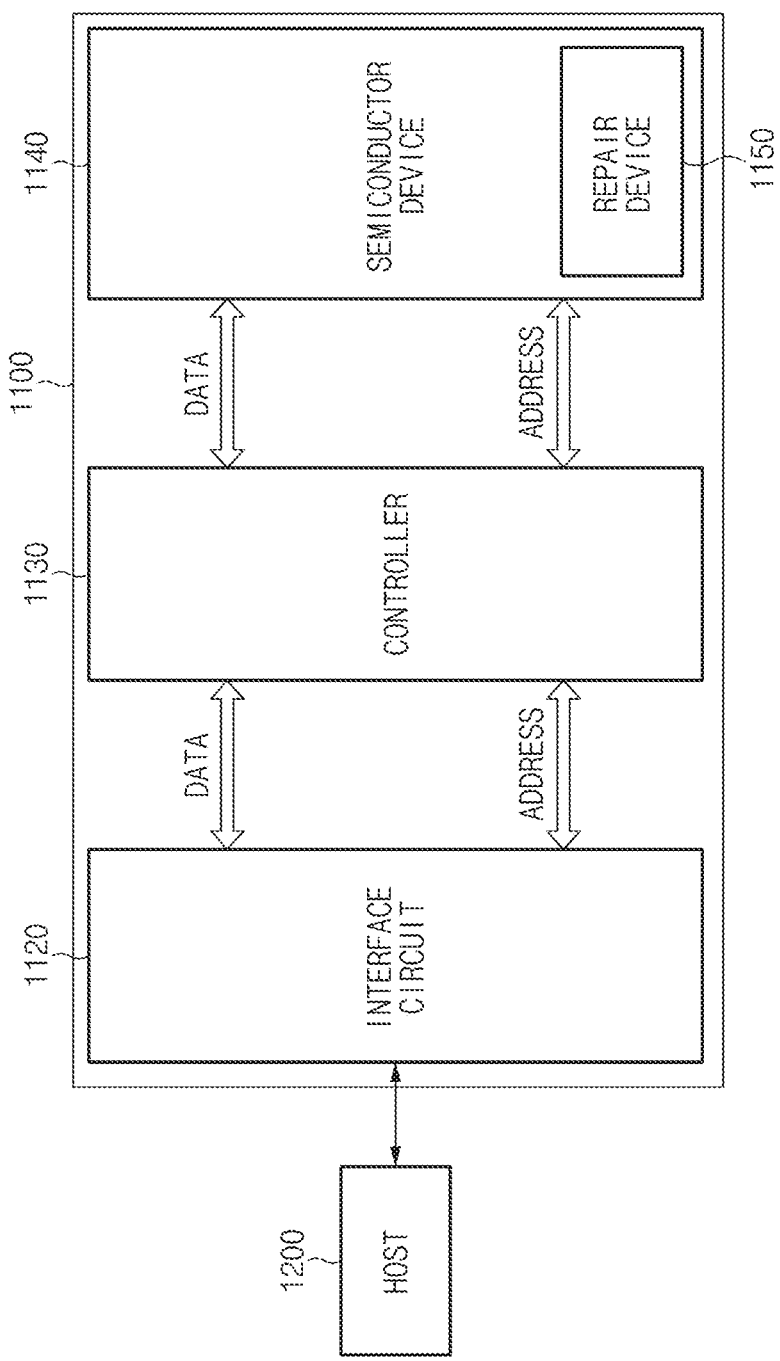
FIG. 4 is a block diagram illustrating a representation of an example of a memory system based on the semiconductor device according to an embodiment of the present disclosure.

FIG. 4 is a block diagram illustrating a representation of an example of a memory system using the semiconductor device according to the embodiment of the present disclosure.

Referring to FIG. 4, the memory system 1100 may include a semiconductor device 1140, an interface circuit 1120, and a controller 1130.

The interface circuit 1120 may provide interfacing between the memory system 1110 and the host 1200. The interface unit 1120 may include a data exchange protocol corresponding to the host 1200 to interface with the host 1200.

The interface circuit 1120 may be configured to communicate with the host 1200 through one of various interface protocols, for example, a Universal Serial Bus (USB) protocol, a Multimedia Card (MMC) protocol, a Peripheral Component Interconnect-Express (PCI-E) protocol, a Serial Attached SCSI (SAS) protocol, a Serial Advanced Technology Attachment (SATA) protocol, a Parallel Advanced Technology Attachment (PATA) protocol, a Small Computer System Interface (SCSI) protocol, an Enhanced Small Disk Interface (ESDI), and an Integrated Drive Electronics (IDE) protocol.

The controller 1130 may receive data and address from an external part through the interface circuit 1120. The controller 1130 may access the semiconductor device 1140 by referring to data and address received from the host 1200. The controller 1130 may transfer data read from the semiconductor device 1140 to the host 1200 through the interface circuit 1120.

The semiconductor device 1140 may include the repair device 1150 illustrated in FIG. 2. The semiconductor device 1140 may be used as a storage medium of the memory system 1100.

The memory system 1100 illustrated in FIG. 4 may be mounted to information processing devices, for example, a personal digital assistant (PDA), a portable computer, a web tablet, a digital camera, a portable media player (PMP), a mobile phone, a wireless phone, a laptop computer, etc. The memory system 1100 may be any of a multimedia card (MMC), a Secure Digital (SD) card, a micro SD card, a memory stick, an ID card, a Personal Computer Memory Card International Association (PCMCIA) card, a chip card, a USB card, a smart card, a Compact Flash (CF) Card, etc.

As is apparent from the above description, the semiconductor device including the repair device according to the embodiments of the present disclosure can reduce the number of defective repairing times by allocating priorities to fuses for use in the repair device configured to support a plurality of post package repairs (PPRs), resulting in increased reliability of the semiconductor memory device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A repair device comprising:
    a buffer circuit configured to generate an address by buffering an external address during a soft-post package repair (SPPR) mode; and
    a plurality of PPR fuse sets configured to output a fuse signal including repair information by latching the address during the SPPR mode, and generate a reset signal corresponding to a fuse signal during activation of an SPPR enable signal,
    wherein, if any one of the plurality of PPR fuse sets is selected in response to a selection signal, the remaining PPR fuse sets are initialized in response to the reset signal, and
    wherein the reset signal is activated when the SPPR enable signal and the fuse signal are activated.

2. The repair device according to claim 1, wherein the buffer circuit is configured to control the SPPR mode according to a mode register set (MRS).

3. The repair device according to claim 1, further comprising:
    a fuse selection circuit configured to generate a plurality of selection signals for selecting the plurality of PPR fuse sets in response to a mode signal needed to establish the SPPR mode,
    a soft-post package repair (SPPR) controller configured to store the address based on a mode signal for establishing the SPPR mode and a command signal, and generate the SPPR enable signal.

4. The repair device according to claim 3, wherein the fuse selection circuit is configured to sequentially activate the plurality of selection signals.

5. The repair device according to claim 3, wherein the SPPR controller is configured to control the SPPR enable signal in response to a comparison result between the address and the pre-stored repair address information.

6. The repair device according to claim 3, wherein the SPPR controller further includes:
    an address storage circuit configured to store the address.

7. The repair device according to claim 1, wherein the address includes row address information and bank address information from among repair address information.

8. The repair device according to claim 1, further comprising:
    a normal fuse set configured to store the address, and output a fuse signal for controlling a repair operation in a normal repair mode,
    wherein the buffer circuit is configured to receive a mode signal,
    wherein if the mode signal is activated, the repair device enters the SPPR mode and stores the address in the plurality of PPR fuse sets, and
    wherein if the mode signal is deactivated, the repair device terminates the SPPR mode and enters a normal repair mode for controlling the normal fuse set.

9. The repair device according to claim 8, wherein the SPPR enable signal is an enable signal for activating the PPR fuse sets instead of the normal fuse set when the repair device enters the SPPR mode.

10. The repair device according to claim 8, wherein the SPPR controller is configured to generate an SPPR flag signal for masking an output signal of the normal fuse set.

11. The repair device according to claim 8, wherein the normal fuse set is a fuse set including a plurality of vendor-purposed fuses.

12. The repair device according to claim 1, wherein the plurality of PPR fuse sets includes:
    a first PPR fuse set configured to output a first fuse signal by latching the address when a first selection signal is activated during the SPPR mode, and to be initialized by activation of a first reset signal; and
    a second PPR fuse set configured to output a second fuse signal by latching the address when a second selection signal is activated during the SPPR mode, and to be initialized by activation of a second reset signal.

13. The repair device according to claim 12, wherein the first PPR fuse set includes:
    a first latch circuit configured to latch the address during activation of the first selection signal, and to be initialized by activation of the first reset signal;
    a first comparator configured to output the first fuse signal by comparing an output address of the first latch circuit with the address; and
    a first reset circuit configured to activate the first reset signal when the SPPR enable signal and the first fuse signal are activated.

14. The repair device according to claim 12, wherein the second PPR fuse set includes:
    a second latch circuit configured to latch the address by activation of the second selection signal, and to be initialized by activation of the second reset signal;
    a second comparator configured to output the second fuse signal by comparing an output address of the second latch circuit with the address; and
    a second reset circuit configured to activate the second reset signal when the SPPR enable signal and the second fuse signal are activated.

15. The repair device according to claim 12, wherein:
    if the first PPR fuse set is selected in response to the first selection signal, the second PPR fuse set is initialized in response to the second reset signal.

16. A semiconductor device comprising:
    a buffer circuit configured to generate an address by buffering an external address during a soft-post package repair (SPPR) mode;
    a plurality of PPR fuse sets configured to output a fuse signal including repair information by latching the address during the SPPR mode, and generate a reset signal corresponding to a fuse signal during activation of an SPPR enable signal; and
    a bank group configured to access a redundancy memory cell in response to the fuse signal, and perform a repair operation,
    wherein, if any one of the plurality of PPR fuse sets is selected in response to a selection signal, the remaining PPR fuse sets are initialized in response to the reset signal, and
    wherein the reset signal is activated when the SPPR enable signal and the fuse signal are activated.

17. The semiconductor device according to claim 16, further comprising:
   a fuse selection circuit configured to generate a plurality of selection signals for selecting the plurality of PPR fuse sets in response to a mode signal needed to establish the SPPR mode;
   a soft-post package repair (SPPR) controller configured to store the address based on a mode signal for establishing the SPPR mode and a command signal, and generate the SPPR enable signal; and
   a normal fuse set configured to store the address, and output a fuse signal for controlling a repair operation in a normal repair mode.

18. The semiconductor device according to claim 17, wherein the SPPR controller is configured to generate an SPPR flag signal for masking an output signal of the normal fuse set.

19. The semiconductor device according to claim 16, wherein each of the plurality of PPR fuse sets includes:
   a latch circuit configured to latch the address during activation of the selection signal, and to be initialized by activation of the reset signal;
   a comparator configured to output the fuse signal by comparing an output address of the latch circuit with the address; and
   a reset circuit configured to activate the reset signal when the SPPR enable signal and the fuse signal are activated.

20. A repair device comprising:
   a plurality of PPR fuse sets configured to output a fuse signal including repair information by latching an address during a soft-post package repair (SPPR) mode, and generate a reset signal corresponding to a fuse signal during activation of an SPPR enable signal,
   wherein, if any one of the plurality of PPR fuse sets is selected, the remaining PPR fuse sets are initialized in response to the reset signal, and
   wherein the reset signal is activated when the SPPR enable signal and the fuse signal are activated.

* * * * *